United States Patent
Taft et al.

[11] Patent Number: 6,127,855
[45] Date of Patent: *Oct. 3, 2000

[54] SWITCH-CAPACITOR CIRCUIT WITH OVERDRIVE-PROTECTED SWITCH

[75] Inventors: Robert Callaghan Taft, Munich, Germany; Brian Paul Brandt, Windham, N.H.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/134,048

[22] Filed: Aug. 14, 1998

[51] Int. Cl.$^7$ ..................................................... H03K 5/00

[52] U.S. Cl. ................... 327/91; 327/94; 327/337

[58] Field of Search .................................... 327/337, 554, 327/94, 365, 407, 408, 437, 427, 90, 91, 93, 96; 330/9

[56] References Cited

U.S. PATENT DOCUMENTS

| | | | |
|---|---|---|---|
| 5,463,394 | 10/1995 | Sun | 341/136 |
| 5,534,819 | 7/1996 | Gunter et al. | 327/553 |
| 5,642,059 | 6/1997 | Scoones | 326/86 |

OTHER PUBLICATIONS

Hosotani, S, Miki, Takahiro, Maeda, Atsushi & Yazawa, Nobuharu, "An 8–bit 20–MS/s CMOS A/D Converter with 50–mW Power Consumption," *IEEE Journal of Solid State Circuits, vol. 25, No. 1, Feb. 1990*, pp. 167–172.

*Primary Examiner*—Dinh T. Le
*Attorney, Agent, or Firm*—Limbach & Limbach L.L.P.

[57] ABSTRACT

An input switch for use in a switch-capacitor circuit having unified architecture, and a switch-capacitor circuit including such an input switch, an amplifier, a capacitor between the amplifier and switch, and at least one NMOS transistor. The input switch samples an input potential in a sampling mode, receives a reference potential, and includes a transmission gate having a first NMOS transistor. The switch is configured to prevent the transmission gate from passing the reference to the capacitor when the reference is so low that the difference between the sampled input and reference is below an overdrive-causing level, thereby preventing capacitor charge loss which would otherwise lead to overdrive while the switch-capacitor circuit compares the reference with the sampled input. When the transmission gate includes a first PMOS transistor connected in parallel with the first NMOS transistor, the switch preferably includes an extra PMOS transistor in series with the first PMOS transistor and the trigger circuitry operates in the comparison mode to prevent the transmission gate from passing the reference to the capacitor when the reference is such that the difference between the sampled input and reference is below the overdrive-causing level.

32 Claims, 4 Drawing Sheets

SWITCH-CAPACITOR CIRCUIT WITH OVERDRIVE-PROTECTED SWITCH

BACKGROUND OF THE INVENTION

1. Field of the Invention

The present invention relates generally to switch-capacitor (S-C) circuits, such as capacitors having unified architecture. More particularly, the invention is an improved switch (for a capacitor having unified architecture or another S-C circuit) which prevents capacitor charge loss which would otherwise result from overdriving the S-C circuit (e.g., during comparison of a reference potential with a previously sampled input potential). Overdriving of an S-C circuit results from applying a reference voltage that is significantly larger or smaller than an input potential previously sampled onto the input capacitor.

2. Description of the Related Art

FIG. 1 is a simplified block diagram of a conventional switch-capacitor (S-C) circuit having so-called "unified architecture." The expression "unified architecture" denotes that the circuit is used to compare the input potential $V_{IN}$ with at least two different reference potentials, i.e., the reference potentials denoted as $V_{MAJ}$ and $V_{MIN}$ in FIG. 1. The S-C circuit of FIG. 1 is used to sample $V_{IN}$ onto capacitor C, and also to provide voltage gain. Conventionally, switching circuitry S1 of FIG. 1 is implemented as three transmission gates S1A, S1B, and S1C connected in parallel (with each transmission gate including a PMOS transistor and a NMOS transistor connected in parallel, and being controlled by a complementary pair of the control signals "CONTROL"). Circuitry S1 can selectively couple to Node B any one of multiple input nodes (i.e., the input nodes at which potentials $V_{IN}$, $V_{MAJ}$ and $V_{MIN}$ are asserted). The present invention pertains to an improvement over conventional implementations of switching circuitry S1, and to improved S-C circuits which include such improved switching circuitry.

Due to the conventional design of each of transmission gates S1A, S1B, and S1C, with the PMOS transistor of each transmission gate controlled by one of control signals "CONTROL" and the NMOS transistor thereof controlled by the complement of such control signal (the complement asserted to the gate of the NMOS transistor has opposite polarity to the control signal asserted to the gate of the PMOS transistor), any signal level of a selected one of the inputs can be transmitted when the transmission gate for such input is on, and any signal level of each non-selected one of the inputs can be blocked when both the NMOS and PMOS devices of the transmission gate for such input have been turned off. Usually the control signals for transmission gates S1A, S1B, and S1C will be non-overlapping, so that after sampling $V_{IN}$ (passing $V_{IN}$ through to Node B), switch S1A will be turned off before either S1B or S1C is turned on. The present invention pertains to an improvement over the conventional transmission gate implementation of switches S1A, S1B, and S1C, resulting in a substantial performance improvement of the S-C circuit in cases where the S-C circuit would otherwise experience overdrive. The term "overdrive" is used herein to denote the application of a reference voltage substantially different than the input voltage Vin.

The expression "switch-capacitor circuit" (abbreviated as "S-C circuit") is used herein to denote a circuit coupled to receive multiple input signals (each having a potential), and which includes a capacitor, a set of input switches controllable to assert a selected sequence of the input signals to one side of the capacitor, and circuitry (including at least one transistor, and typically including an amplifier) coupled to the other side of the capacitor. For example, an S-C circuit can be a capacitor having unified architecture if the circuitry coupled to the other side of the capacitor is appropriately designed to cause the S-C circuit to implement the function of a capacitor.

The design of the FIG. 1 circuit makes it useful in an analog-to-digital (A-to-D) converter. It is known to implement an A-to-D converter in which each of several circuits (each including an S-C circuit of the FIG. 1 type) compares an analog input voltage ($V_{IN}$) to each of a number of reference voltages (e.g., to a "coarse comparison" reference potential $V_{MAJ}$ and a "fine comparison" reference potential $V_{MIN}$). In such an A-to-D converter, the output ($V_{OUT}$) of each implementation of the S-C circuit of FIG. 1 is an amplified version of the difference between $V_{IN}$ and $V_{MAJ}$ followed by the difference between $V_{IN}$ and $V_{MIN}$, and is either amplified further by another S-C circuit or applied directly to a capacitor. Several channels, each consisting of an S-C circuit of the FIG. 1 type followed by further S-C circuits leading to a capacitor (or directly followed by a capacitor), can be implemented in parallel to implement a high-speed A-to-D converter. An A-to-D converter having such parallel configuration is typically referred to as a "flash" A-to-D converter. More specifically, since the circuit of FIG. 1 is designed for performing two comparisons, a coarse comparison between Vin and Vmaj followed by a fine comparison between Vin and Vmin, this configuration is known as a two-step flash architecture.

Typically, each control signal of the control signal set CONTROL of FIG. 1 is indicative of a binary bit, and a flash A-to-D converter would typically include several S-C circuits of the type shown in FIG. 1, each for comparing the input voltage $V_{in}$ (sequentially) with a different pair of coarse and fine reference voltages.

With reference to FIG. 1, analog input voltage $V_{IN}$ and reference voltages $V_{MAJ}$ and $V_{MIN}$ are supplied to different inputs of switching circuitry S1, one to each of transmission gates S1A, S1B, and S1C. Switching circuitry S selects any one of voltages $V_{IN}$, $V_{MAJ}$, and $V_{MIN}$ in response to the control signals identified as "CONTROL" in FIG. 1. The voltage signal selected by circuitry S1 (identified as "$V_{INT}$") is asserted to Node B. Capacitor C is connected between Node B and the input (Node A) of amplifier "Amp." The amplifier (Amp) needs to be an inverting amplifier, and can be as simple as an NMOS common source amplifier with a PMOS current load, whose voltage gain is set by the addition of a second capacitor between the amplifier's input and output.

Switch S2 (shown implemented as an NMOS transistor whose gate is coupled to receive control signal CONTROL2), connected between the input and output of amplifier Amp, is in either an open or closed configuration depending on the value of control signal CONTROL2. Switch S2 could alternatively consist of a transmission gate which is a parallel combination of an NMOS and PMOS device. However, typically switch S2 is a single NMOS device as shown, especially in implementations in which the virtual ground potential (Vb) established at the amplifier's input and output when S2 is closed is low (e.g., when Vb is 0.8 volt above ground, where ground is defined for purposes of this discussion as 0 volts). With switch S2 implemented as a single NMOS device, only large negative values of node A will result in charge loss from the plate of capacitor C that is coupled to Node A (by the NMOS source diffusions of switch S2 injecting charge into the substrate). Since all input voltages and supplies are typically above ground for single supply operation, we next explain how node A can be forced to a large negative potential during operation of a two-step flash A-to-D converter including the FIG. 1 circuit. During typical operation of such an A-to-D converter, control signals are asserted to switches S1A, S1B, S1C, and S2 to cause the FIG. 1 circuit to perform the following steps:

transmission gate switch S1A is closed to assert input potential $V_{IN}$ to Node B while switch S2 is closed so there is a virtual ground at Node A. Thus, Node A settles to a "virtual ground" potential Vb, and a charge $Q=C(Vb-V_{IN})+C_S Vb$ builds up on one plate of capacitor C, where $C_S$ is the stray capacitance at Node A. Virtual ground potential Vb is set by the characteristics of amplifier Amp. Sampling of $V_{IN}$ is accomplished by opening switch S2, after which charge Q represents a memory of the voltage $V_{IN}$;

then, potential $V_{MAJ}$ is asserted to Node B to implement the "coarse comparison" (by opening transmission gate S1A and closing transmission gate S1B) while switch S2 is open. Ideally, there is no charge loss from capacitor C, Node A settles at a potential V', and the charge on the same plate of capacitor C is $Q'=C(V'-V_{MAJ})+C_S V'=Q$. Thus, $V'-Vb=C(V_{MAJ}-V_{IN})/(C+C_S)$. If $V_{MAJ}$ is equal to the previously sampled voltage $V_{IN}$, then node A will be at Vb, and so will the output $V_{OUT}$. This ignores nonideal effects such as the charge injected by switch S2 as it opens. The circuitry connected to the output of amplifier Amp will know that reference potential $V_{MAJ}$ is above the sampled input potential $V_{IN}$ if $V_{OUT}$ is below Vb, and that reference potential $V_{MAJ}$ is below the sampled input potential $V_{IN}$ if $V_{OUT}$ is above Vb;

then, potential $V_{MIN}$ is asserted to Node B to implement the "fine comparison" (by opening transmission gate switches S1A and S1B and closing transmission gate switch S1C) while switch S2 is open. Ideally, there is no charge loss from capacitor C, Node A settles at a potential V", and the charge on capacitor C is $Q''=C(V''-V_{MIN})+C_S V''=Q$. Accordingly (assuming no charge loss from capacitor C), $V''-Vb=C(V_{MIN}-V_{IN})/(C+C_S)$. As before, the circuitry connected to the output of amplifier Amp will know that reference potential $V_{MIN}$ is above the sampled $V_{IN}$ if $V_{OUT}$ is below Vb, and that reference potential $V_{MIN}$ is below the sampled $V_{IN}$ if $V_{OUT}$ is above Vb. However, this is only true if the charge on the sampling capacitor C was not significantly disturbed during the coarse (previous) comparison.

In variations on the FIG. 1 circuit, more than two reference potentials are supplied as inputs to an implementation of switching circuit S1 that includes more than three transmission gates (and more than two comparisons are sequentially performed), or only a single reference potential (e.g., $V_{MAJ}$) is supplied as an input to an implementation of switching circuit S1 that includes only two transmission gates and only a single comparison (of the reference potential with input potential $V_{IN}$) is performed.

A problem with the conventional design of the S-C circuit of FIG. 1 (and variations thereon) is that if one of the reference potentials (e.g., $V_{MAJ}$, which will be assumed to be the lower one of potentials $V_{MAJ}$ and $V_{MIN}$ in the following discussion) is much less than the sampled input potential $V_{IN}$, the potential at Node A (potential V') plunges below ground potential (i.e., zero volts, in contrast with virtual ground potential Vb which is greater than zero volts) during the coarse comparison (the comparison of $V_{MAJ}$ and $V_{IN}$).

This can forward-bias the source diffusion of the NMOS device which implements switch S2, leading to charge loss from capacitor C. Overdrive of the S-C circuit during coarse comparison makes the subsequent fine comparison (of $V_{MIN}$ and $V_{IN}$) inaccurate by virtue of errors introduced in the charge stored on capacitor C. Furthermore, this overdrive of the S-C circuit can be deleterious not just because of the charge loss on capacitor C, since the injected charge can undesirably be collected by adjacent circuitry. The collected charge can lead to errors on charge storage on other capacitors, can lead to noise in amplifiers, or even worse trigger latch-up (in which an unintended conduction path becomes active). For a specific difference $V_{IN}-V_{MAJ}$, the amount of charge injection or loss at node A depends on many parameters including the virtual ground potential and the relative magnitude of the capacitor C compared to the capacitance at the amplifier input and stray capacitance.

For example, if $V_{IN}$=2.6 Volts; $V_{MAJ}$=0.6 Volt; $V_{MIN}$=2.48 Volts; and the virtual ground potential at Node A (when switch S2 is closed) is Vb=0.8 Volt, it is possible that there may be charge loss from capacitor C during comparison of $V_{MAJ}$ and $V_{IN}$ by the conventional S-C circuit of FIG. 1.

Until the present invention, it had not been known how to overcome the noted problem with conventional S-C circuits having unified architecture in a power efficient manner.

SUMMARY OF THE INVENTION

In a class of preferred embodiments, the invention is an improved input switch for use in an S-C circuit (such as a capacitor having unified architecture) which includes an amplifier, a capacitor coupled between the amplifier and the input switch, and at least one NMOS transistor coupled to the amplifier and the capacitor. The inventive switch is coupled and configured to sample an input potential in a sampling mode and to receive a reference potential, and includes a transmission gate. The inventive switch is configured to prevent the transmission gate from passing the reference potential to the capacitor when the reference potential is so low that the difference between the sampled input potential and reference potential (the "difference potential") is below an "overdrive-causing" level, thereby preventing capacitor charge loss which would otherwise lead to overdrive while the S-C circuit compares the reference potential with the sampled input potential.

In a class of preferred embodiments, the transmission gate of the inventive switch includes a first NMOS transistor, and the switch includes an extra NMOS transistor (in series with the first NMOS transistor) and trigger circuitry configured to operate during the comparison mode to drive the gate of the extra NMOS transistor to a level sufficient to turn off the extra NMOS transistor (when the reference potential is below a trigger level), thereby preventing the first NMOS transistor from passing to the capacitor a reference potential so low that the difference potential is below the overdrive-causing level. Preferably, the gate of the extra NMOS transistor (e.g., transistor N3 of FIG. 2) is driven low in the following manner when the reference potential ($V_{MAJ}$) is below the trigger level: the input potential $V_{IN}$ is sampled onto the gate of a third transistor (e.g., transistor N5 of FIG. 2) of the trigger circuitry during a preliminary sampling mode of operation; and at the end of the sampling mode (at the start of a comparison mode), the third transistor is "on" if there is a sufficiently large difference between the sampled input potential $V_{IN}$ and the reference potential $V_{MAJ}$ asserted to its source. When the third transistor is on, it asserts a voltage to the gate of the extra NMOS transistor which prevents the extra NMOS transistor from turning on.

When the transmission gate includes a first PMOS transistor (e.g., a first PMOS transistor connected in parallel with a first NMOS transistor), the switch can include an extra PMOS transistor in series with the first PMOS transistor, and the trigger circuitry operates in the comparison mode to prevent the transmission gate from passing the reference potential to the capacitor when the reference potential has such a value that the difference between the sampled input and reference is below the overdrive-causing level, thereby preventing the first PMOS transistor from passing to the capacitor a reference potential having such a value that the difference potential is below the overdrive-causing level.

In preferred implementations, the inventive switch includes a capacitor (e.g., tipping capacitor $C_{tip}$ of FIG. 2) connected to tip the switch's output node in the same direction as would the reference potential (during comparison of the reference potential with the previously sampled input potential), to ensure that the S-C circuit's amplifier is driven in the correct direction even in the event that the trigger circuitry prevents the switch's transmission gate from passing the reference potential to the switch's output node (and thus to an S-C circuit's capacitor coupled to the output node).

Another aspect of the invention is an S-C circuit including any embodiment of the improved input switch of the invention.

DETAILED DESCRIPTION OF THE PREFERRED EMBODIMENTS

Figure 1:
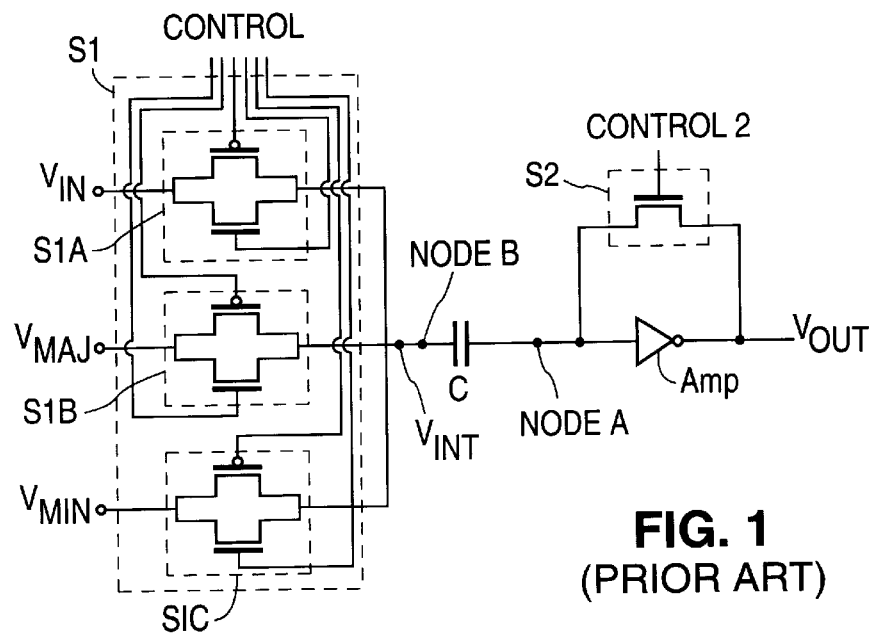
FIG. 1 is a block diagram of an S-C circuit which can be implemented in either a conventional manner, or in accordance with the invention.
Figure 2:
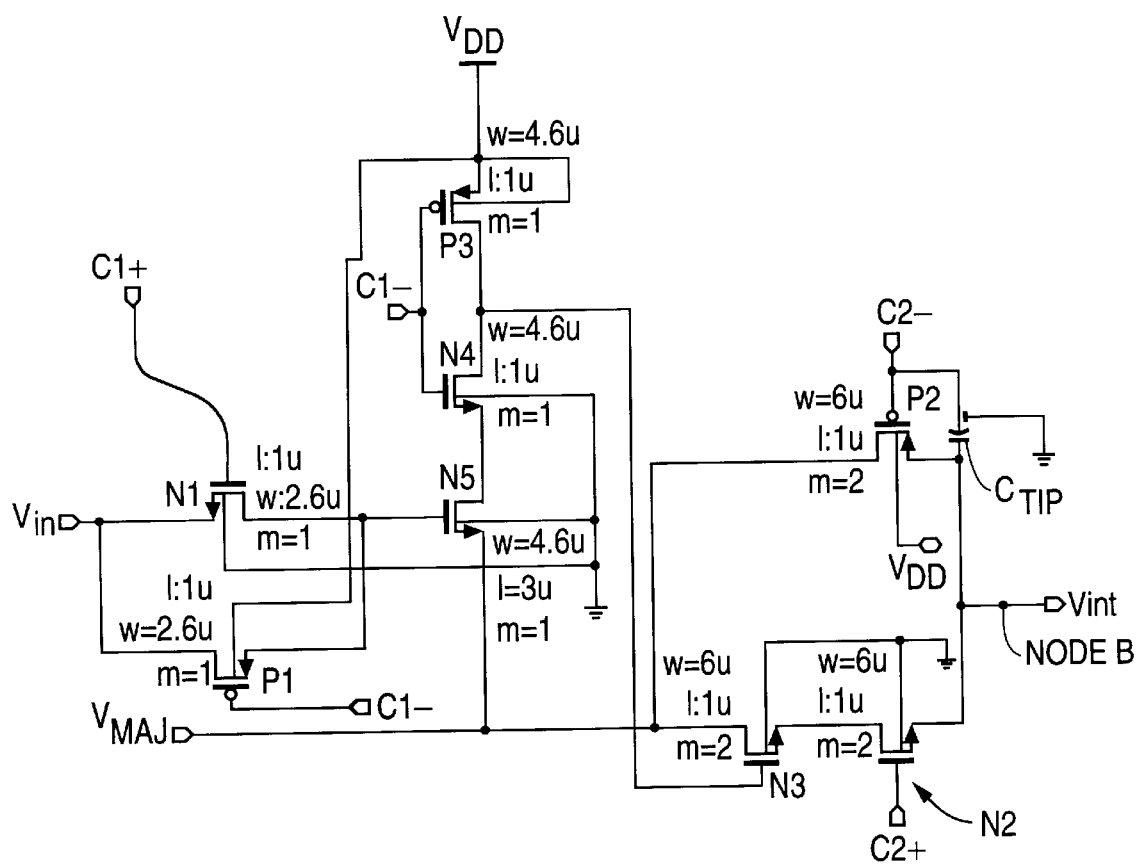
FIG. 2 is a schematic diagram of an embodiment of the inventive switch, which can implement that portion of switch S1B or S1C of FIG. 1 which selectively passes potential $V_{MAJ}$ to Node B of FIG. 1.

FIG. 2 is a schematic diagram of an embodiment of the inventive switch, which can replace switch S1B of FIG. 1 which selectively passes potential $V_{MAJ}$ to Node B of FIG. 1. It should be appreciated that the FIG. 2 circuit can also replace switch S1C of FIG. 1 in cases in which it is possible that reference potential $V_{MIN}$ can cause overdrive. Node B of FIG. 2 corresponds to Node B of FIG. 1 (it is one plate of capacitor C), and control signals C1−, C1+, C2−, and C2+ of FIG. 2 are a subset of the set of control signals identified as "CONTROL" in FIG. 1. Typically, the FIG. 2 circuit is implemented as a portion of an integrated circuit, and its ground potential (referred to herein as 0 volts for specificity) is ground potential for the integrated circuit. The node labeled $V_{DD}$ is held at a supply potential $V_{DD}$, which typically is provided by a battery or power supply, and typically is equal to about three or five volts above ground potential.

The FIG. 2 circuit receives both input potential $V_{IN}$ and reference potential $V_{MAJ}$ and asserts to Node B an output potential ($V_{INT}$) which is substantially equal to reference potential $V_{MAJ}$ when control bits C1−, C1+, C2−, and C2+ have the following values: C1− is high (above the turn on potential of each NMOS transistor of FIG. 2 and above the turn off potential of each PMOS transistor of FIG. 2), C1+ is low (below the turn on potential of each NMOS transistor and below the turn off potential of each PMOS transistor), C2− is low, and C2+ is high. Typically, the low value for each control bit is 0 volts (ground potential), and the high value for each control bit is $V_{DD}$.

When the control bits have the opposite values (when C1− is low, C1+ is high, C2− is high, and C2+ is low), Node B is decoupled from $V_{MAJ}$. Instead, Node B is coupled through capacitor $C_{tip}$ to the gate of transistor P2 (to which control bit C2− is asserted). Typically when the FIG. 2 circuit is in this state, other switching circuitry (not separately shown in FIG. 2, but included within switching circuitry S1 of FIG. 1 and coupled to Node B) is in a state causing Node B to move rapidly to another reference potential (e.g., $V_{MIN}$) or sampled input potential $V_{IN}$.

As shown in FIG. 2, the channels of PMOS transistor P2 and NMOS transistor N2 are connected in parallel between the input node at reference potential $V_{MAJ}$ and output Node B. NMOS transistor N3 is connected (with its channel in series with that of transistor N2) between this input node and the drain of transistor N2. The gates of P2 and N2 are coupled to receive control bit signals C2− and C2+, respectively.

Transistors N1, P1, P3, N4, and N5 (connected as shown) comprise a trigger circuit for controlling the gate potential of transistor N3. The channels of PMOS transistor P1 and NMOS transistor N1 are connected in parallel between the input node at input potential $V_{IN}$ and the gate of NMOS transistor N5. PMOS transistor P3 and NMOS transistor N4 are connected with their channels in series between the top rail and the drain of transistor N5. The source of transistor N5 is coupled to receive $V_{MAJ}$ and to the common drains of P2 and N3. The gates of transistors P3 and N4 are coupled to receive control bit signal C1−. The gates of P1 and N1 are coupled to receive control bit signals C1− and C1+, respectively.

One plate of capacitor $C_{tip}$ is connected to receive control signal C2− and to the gate of transistor P2, and the other plate of capacitor $C_{tip}$ is connected to Node B and thus to the common sources of transistors P2 and N2.

In operation, control bits C1−, C1+, C2−, and C2+ are asserted to the FIG. 2 circuit with the following sequence of values:

first, C1− and C2+ are low and C1+ and C2− are high (during sampling, and assertion to Node B, of input potential $V_{IN}$ while switch S2 of FIG. 1 is closed to hold Node A at virtual ground potential Vb);

then (after switch S2 and S1A have opened), C1− and C2+ are high and C1+ and C2− are low (during assertion of reference potential $V_{MAJ}$ to Node B while switch S2 of FIG. 1 is open).

We first consider the manner in which the FIG. 2 circuit operates in the case that C1− and C2+ are low and C1+ and C2− are high. In this case, NMOS transistors N2 and N4 and PMOS transistor P2 are off, and NMOS transistor N1 and PMOS transistor P1 are on. Thus, input potential $V_{IN}$ is sampled (through the channels of N1 and P1) onto the gate of NMOS transistor N5. If $V_{IN}$ is very low (so that the voltage between the gate and source of P1 is sufficiently small to turn off transistor P1), transistor N1 passes $V_{IN}$ to the gate of transistor N5. If $V_{IN}$ is very large (so that the voltage between the gate and source of P1 is sufficiently small to turn off transistor N1), transistor P1 passes $V_{IN}$ to the gate of transistor N5. While control bits C1−, C2+, C1+, and C2− have the indicated values, a sample of input potential $V_{IN}$ can be passed through to one plate of the S-C circuit's capacitor C (by switch S1A of FIG. 1). While Node B moves to the sampled input potential $V_{IN}$, switch S2 of the S-C circuit (shown in FIG. 1) is in a closed configuration so that the other plate of capacitor C is at virtual ground. Switch S1A causes Node B to move rapidly to the sampled input potential $V_{IN}$, despite the fact that Node B is coupled through capacitor $C_{tip}$ of FIG. 2 to the gate of FIG. 2's transistor P2 (to which control signal C2− is asserted).

After Node B is caused to be at the sampled input potential $V_{IN}$, each of control signals C1− and C2+ undergoes a transition to its high level and each of C1+ and C2− undergoes a transition to its low level. In response to the new control bit values, NMOS transistors N2 and N4 and PMOS transistor P2 turn on, and NMOS transistor N1 and PMOS transistors P1 and P3 turn off. The gate of NMOS transistor N5 of FIG. 2 is still at the sampled value of input potential $V_{IN}$, and since the source of transistor N5 is at the reference potential $V_{MAJ}$ (which has a static value), if the sampled value of input potential $V_{IN}$ is sufficiently above $V_{MAJ}$ (i.e., more than a NMOS threshold voltage above $V_{MAJ}$), transistor N5 is "on" and the gate of transistor N3 is pulled (by transistors N4 and N5) rapidly down to the potential $V_{MAJ}$. Thus, since both the gate and drain of transistor N3 are at the potential $V_{MAJ}$, transistor N3 is "off."

With transistor N3 off, Node B is isolated from the input node at which $V_{MAJ}$ is received, unless $V_{MAJ}$ is sufficiently high so that transistor P2 is on. Specifically, PMOS transistor P2 will pass potential $V_{MAJ}$ through to Node B only if potential $V_{MAJ}$ (supplied to the drain of transistor P2) is above P2's gate potential by more than the threshold voltage of transistor P2. Since the gate of transistor P2 is held at C2− (which is zero volts above ground in the described circumstances), transistor P2 will be on only when $V_{MAJ}$ is above the threshold voltage of P2. Since in typical implementations of the FIG. 2 circuit, there will be no significant loss of charge from capacitor C when node B is above ground potential by more than the threshold voltage of transistor P2, the described switching-off of transistor N3 (to prevent passing of undesirably low values of $V_{MAJ}$, e.g., undesirably large negative transient values of $V_{MAJ}$) is adequate to prevent significant charge loss from capacitor C during operation of the FIG. 2 circuit.

In the described operating state sequence, the FIG. 2 circuit "precharges" the gate of NMOS transistor N5 (during the input potential sampling state) to avoid injection of offset currents into the S-C circuit's ladder (during the comparison state in which the sampled input potential is compared with a reference potential).

Assuming that the sampled value of $V_{IN}$ is greater than both $V_{MAJ}$ and ground potential (when control signal C2− is low and control signal C2+ is high), capacitor $C_{tip}$ is coupled as shown to Node B, to tip the output voltage of the FIG. 2 circuit slightly in the appropriate direction (when control signal C2− is low and control signal C2+ is high to turn on transistors P2 and N2) to ensure that the S-C circuit's amplifier (amplifier Amp of FIG. 1) is driven in the correct direction, even in the event both transistors N3 and P2 are off.

If capacitor $C_{tip}$ were omitted and replaced by an open circuit, the FIG. 2 circuit would not determine the potential at Node B when both transistors N3 and P2 are off. Thus, in the mode in which signal C2− is low and signal C2+ is high, the potential at Node B would not necessarily be indicative of the relative levels of $V_{IN}$ and $V_{MAJ}$.

With capacitor $C_{tip}$ connected as shown in FIG. 2, in the operating mode in which signal C2− is low and signal C2+ is high, capacitor $C_{tip}$ pulls down the potential at Node B toward potential C2− (the potential of transistor P2's gate and the upper plate of capacitor $C_{tip}$), even when both transistors N3 and P2 are off. In this operating mode, the potential C2− is typically ground potential. Keeping in mind the assumption that the sampled value of $V_{IN}$ is greater than both $V_{MAJ}$ and ground potential, it is apparent that (when control bit C2− undergoes a transition from high to low and control bit C2+ undergoes a transition from low to high) capacitor $C_{tip}$ functions (with both of transistors P2 and N3 off) to move the potential at Node B in the same direction as the FIG. 2 circuit does when transistor N3 and at least one of transistors P2 and N2 are on. Thus, the FIG. 2 embodiment avoids overdrive of amplifier Amp without introducing ambiguity into a comparison of a sampled value of $V_{IN}$ with $V_{MAJ}$.

In the preferred implementation of the invention shown in FIG. 2, capacitor $C_{tip}$ has capacitance 12fF, which is sufficiently low so that the presence of this capacitor does not undesirably affect the potential at Node B at times when transistor P2 is on (or both of transistors N3 and N2 are on) to pass through potential $V_{MAJ}$ to Node B.

The preferred implementation of the invention shown in FIG. 2 avoids overdrive of amplifier Amp in an extremely power efficient manner. During operation, there is no quiescent power consumption by the branch comprising transistors P3, N4, and N5, since at least one of these transistors is always off.

Preferably, transistor P2 has the same effective size as the PMOS transistors used in the series combination minor switches of typical implementations of the S-C circuit in which the invention is embodied, and transistor N2 has the same effective size as the NMOS transistors used in the series combination minor switches of typical implementations of the S-C circuit in which the invention is embodied.

Although transistor N2 can be connected between Node B and transistor N3 (as shown in FIG. 2), it is preferable instead to reverse the positions of transistors N2 and N3 (as in FIG. 6 to be discussed below) so that transistor N3 is connected between Node B and transistor N2. Also preferably, when implementing the connection between transistors N2 and N3, the inside fingers should be joined to minimize midnode capacitance.

Figure 6:
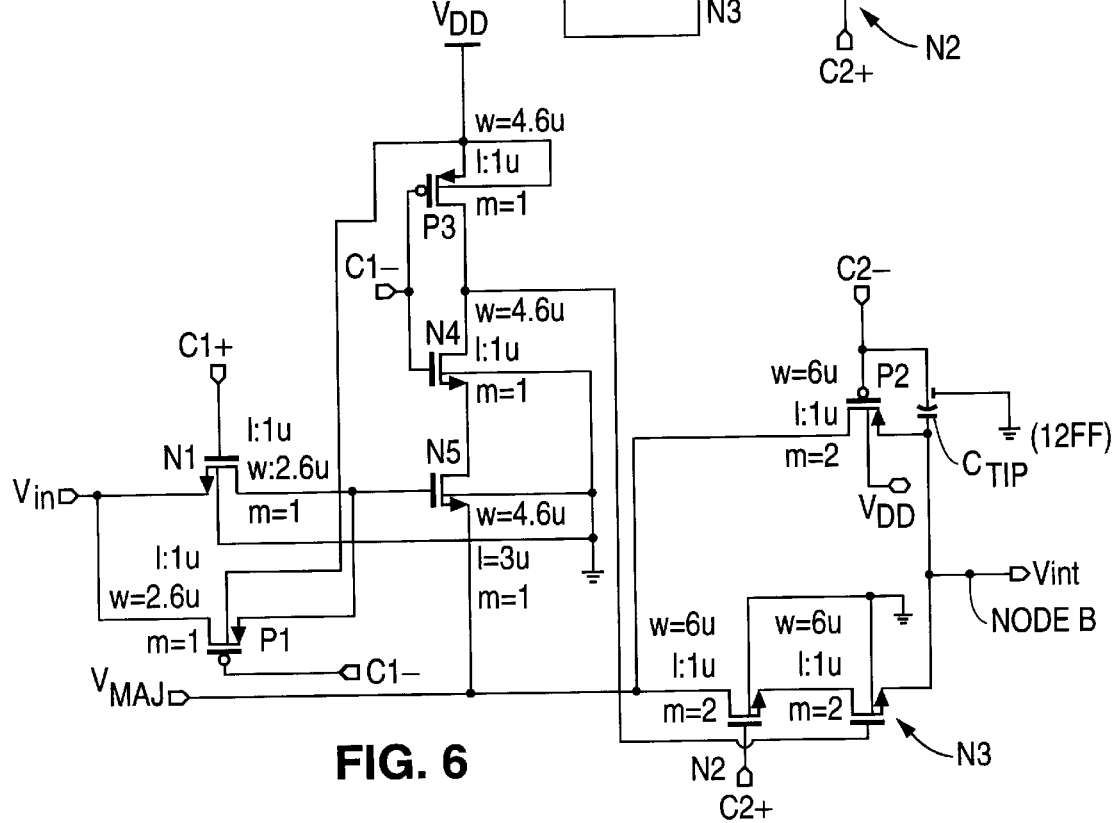
FIG. 6 is a schematic diagram of an embodiment of the inventive switch, which is a variation on the FIG. 2 embodiment with the positions of transistors N2 and N3 reversed.

We next describe FIG. 6, which is a schematic diagram of a variation on the FIG. 2 embodiment of the inventive switch, and which differs from FIG. 2 only in that the positions of transistors N2 and N3 reversed. The advantage of connecting transistor N3 between Node B and transistor N2 (as in FIG. 6) is to prevent the passing of parasitic charge to Node B when transistors N3 is off. In the FIG. 2 embodiment, parasitic charge (stored on the source of N3, the drain of N2, and the metal wiring capacitance) can pass through N2 to Node B even when transistor N3 is off, and this can undesirably affect the potential at Node B. In the FIG. 6 embodiment, such parasitic charge cannot be passed to Node B when transistor N3 is off.

Figure 3:
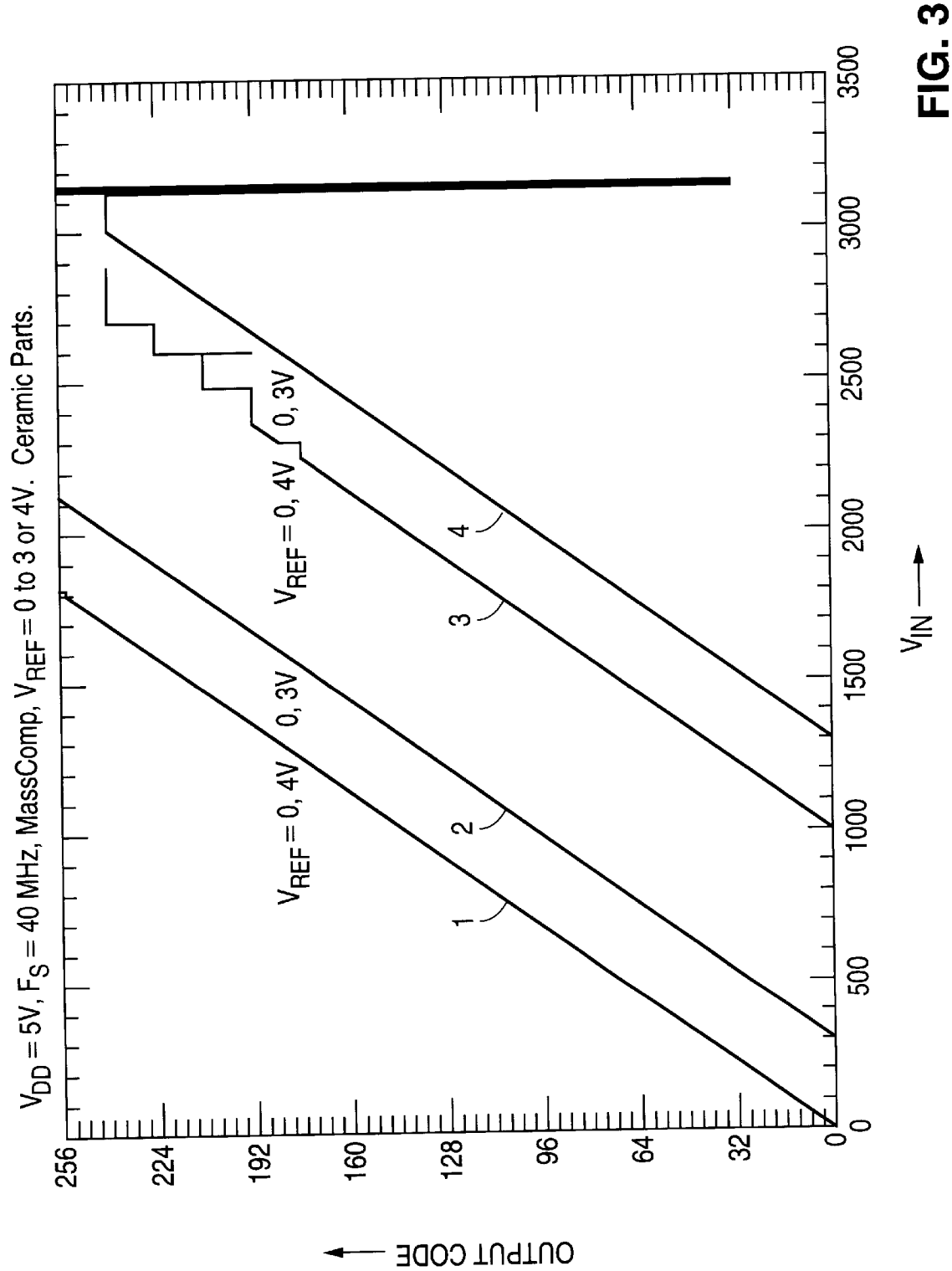
FIG. 3 is a graph representing digital output voltage (indicated by an output code) versus analog input voltage ($V_{IN}$) for an analog-to-digital (A-to-D) converter which includes a conventional implementation of the S-C circuit of FIG. 1, and for such an A-to-D converter modified to include an embodiment of the inventive S-C circuit.

Curves 3 and 4 of FIG. 3 represent measured digital output voltage (indicated by an output code) versus analog input voltage ($V_{IN}$) for an analog-to-digital (A-to-D) converter which includes a conventional implementation of the S-C circuit of FIG. 1 (with $V_{DD}$=5 volts above ground potential). Curves 1 and 2 of FIG. 3 represent measured digital output voltage (indicated by an output code) versus analog input voltage ($V_{IN}$) for an A-to-D converter which includes an embodiment of the inventive S-C circuit (i.e., the conventional implementation of the FIG. 1 S-C circuit with switch circuitry S1 modified to include the FIG. 2 circuit, with $V_{DD}$=5 volts above ground potential). Output voltage is plotted (in an output code indicative of an arbitrary multiple of full scale) on FIG. 3's vertical axis. Input voltage is plotted (in another arbitrary multiple of volts) on FIG. 3's horizontal axis. For curves 1 and 3, the full range (from 0 to 256) on the vertical axis represents the range from zero to four volts; for curves 2 and 4, the full range (from 0 to 256) on the vertical axis represents the range from zero to three volts. Neither curve 3 nor curve 4 is linear (for relatively large values of the input voltage), and it is thus apparent that the conventional converter is subject to severe problems which are due at least primarily to overdrive of the amplifier. The linearity of each of curve 1 and curve 2 (over substantially the full input voltage range) evidences that the inventive converter represents a significant improvement over the prior art.

A variation on the FIG. 2 embodiment will next be described with reference to FIG. 4. The FIG. 4 circuit receives input potential $V_{IN}$ and reference potential $V_{MAJ}$, and normally asserts to Node B an output potential which is substantially equal to reference potential $V_{MAJ}$ when control bits C1−, C1+, C2−, and C2+ are respectively high (above the turn on potential of each NMOS transistor of FIG. 4 and above the turn off potential of each PMOS transistor of FIG. 4), low (below the turn on potential of each NMOS transistor and below the turn off potential of each PMOS transistor), low, and high. The FIG. 4 circuit has the same structure and function as the FIG. 2 circuit, except as explained below.

Figure 4:
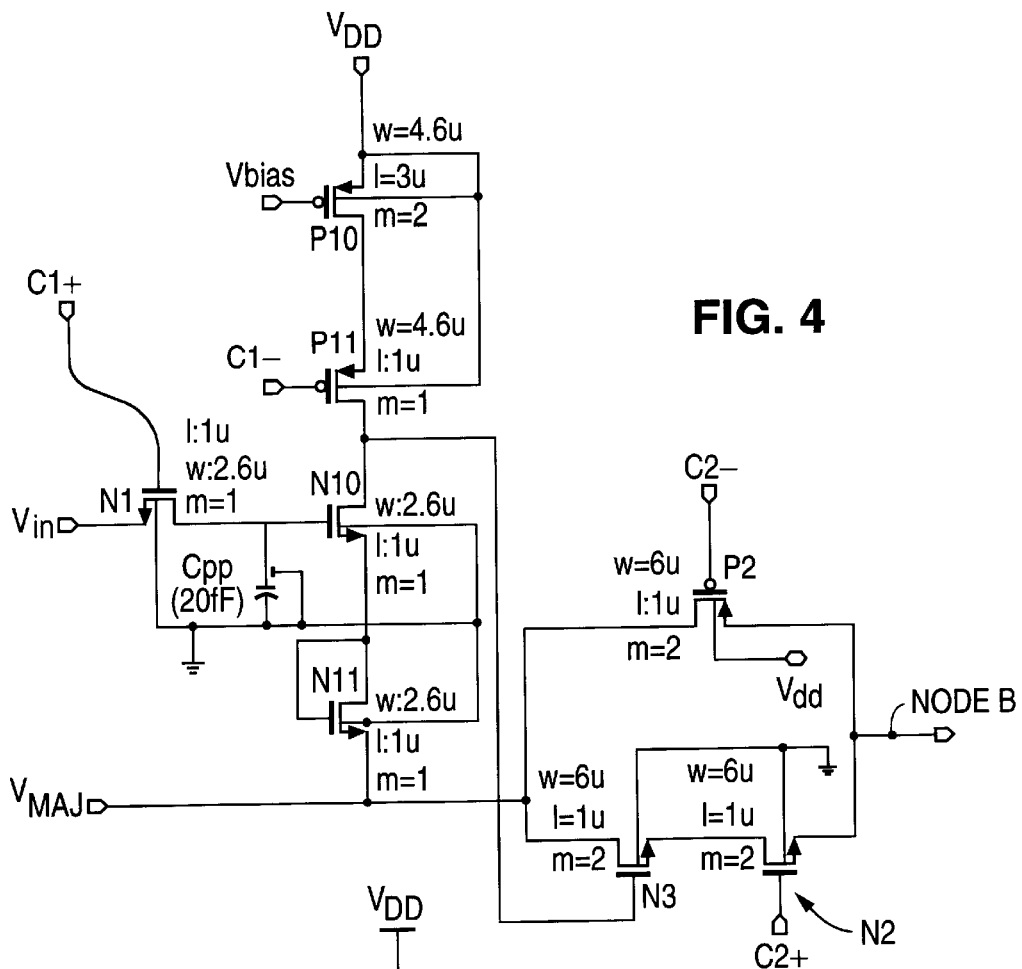
FIG. 4 is a schematic diagram of an alternative embodiment of the inventive switch, which can replace the FIG. 2 circuit to implement switch S1B or S1C of FIG. 1.

As shown in FIG. 4, the channels of PMOS transistor P2 and NMOS transistor N2 are connected in parallel between the input node at reference potential $V_{MAJ}$ and output Node B. NMOS transistor N3 is connected (with its channel in series with that of transistor N2) between this input node and the drain of transistor N2. The gates of P2 and N2 are coupled to receive control bit signals C2− and C2+, respectively.

Transistors N1, P10, P11, N10, and N11 (connected as shown) comprise a trigger circuit for controlling the gate potential of transistor N3. The channel of NMOS transistor N1 is connected between the input node at input potential $V_{IN}$ and the gate of NMOS transistor N10. PMOS transistors P10 and P11 are connected with their channels in series between the top rail and the drain of transistor N10. The source of transistor N10 is coupled to the common gate and drain of diode-connected NMOS transistor N11. The source of N11 is coupled to the common drains of P2 and N3. The gate of transistor P11 is coupled to receive control bit signal C1−, the gate of N1 is coupled to receive control bit signal C1+, and the gate of P10 is biased by a bias potential $V_{bias}$.

Although the FIG. 4 circuit includes no counterpart to capacitor $C_{tip}$ (of FIG. 2), variations on the FIG. 4 embodiment do include such an output "tipping" capacitor. In such variations on the FIG. 4 embodiment, one plate of the output tipping capacitor is connected to the gate of transistor P2, and the other plate is connected to Node B and thus to the common sources of transistors P2 and N2.

In addition, although FIG. 4 includes no counterpart to PMOS transistor P1 (of FIG. 2) which is parallel to device N1 and is gated by control signal C1− as in the circuit of FIG. 2, variations on the FIG. 4 embodiment do include such a PMOS device to allow passing of any signal level of input $V_{IN}$.

In operation of the FIG. 4 circuit (when employed as a replacement for switch S1B of FIG. 1), control bits C1−, C1+, C2−, and C2+ are asserted to the FIG. 4 circuit with the following sequence of values:

first, C1− and C2+ are low and C1+ and C2− are high (during sampling, and assertion to Node B, of input potential $V_{IN}$ while switch S2 of FIG. 1 is closed to hold Node A at virtual ground potential Vb);

then, C1− and C2+ are high and C1+ and C2− are low (during assertion of reference potential $V_{MAJ}$ to Node B while switch S2 of FIG. 1 is open).

We first consider the manner in which the FIG. 4 circuit operates in the case that C1− and C2+ are low and C1+ and C2− are high. In this case, transistors N2 and P2 are off, and transistors N1, P10, and P11 are on. Thus, input potential $V_{IN}$ is sampled (through the channel of transistor N1) onto the gate of NMOS transistor N10 and the 20fF storage capacitor $C_{PP}$. If the sampled input potential $V_{IN}$ is sufficiently high for transistor N10 to be on, a small DC current (e.g., 10 microAmps, with components having the characteristics indicated in FIG. 4) is drawn from the power supply through the channels of P10, P11, N10, and N11. While control bits C1−, C2+, C1+, and C2− have the indicated values, a sample of input potential $V_{IN}$ can be passed through to one plate of the S-C circuit's capacitor C1 (by switch S1A of FIG. 1). While Node B moves to the sampled input potential $V_{IN}$, switch S2 of the S-C circuit (shown in FIG. 1) is in a closed configuration so that the other plate of capacitor C1 is at virtual ground. The switch S1A causes Node B to move rapidly to the sampled input potential $V_{IN}$.

After Node B is at the sampled input potential $V_{IN}$, each of control bits C1− and C2+ undergoes a transition to its high level and each of C1+ and C2− undergoes a transition to its low level. In response to the new control bits, transistors P2 and N2 turn on and transistors N1 and P11 turn off. The gate of NMOS transistor N10 is still at the sampled value of input potential $V_{IN}$, and since the source of transistor N10 is at $V_{MAJ}+V_{threshold}$ (where $V_{MAJ}$ is the static reference potential, and $V_{threshold}$ is the threshold voltage of N11), if the sampled value of input potential $V_{IN}$ is greater by a sufficient amount than $V_{MAJ}$ (i.e., if $V_{IN}>V_{MAJ}+2V_{threshold}$), transistor N10 is "on" and transistors N10 and N11 pull the gate of transistor N3 rapidly down to the potential $V_{MAJ}+V_{threshold}$. Thus, if $V_{MAJ}$ is less than $V_{IN}-2V_{threshold}$, transistor N3 is off. If $V_{MAJ}$ is greater than $V_{IN}-2V_{threshold}$, transistor P2 passes reference potential $V_{MAJ}$ to Node B (although both transistors N10 and P11 are off).

In the case that transistor N3 is off, Node B is isolated from the input node at which $V_{MAJ}$ is received, unless $V_{MAJ}$ is sufficiently high so that transistor P2 is on. Specifically, PMOS transistor P2 passes potential $V_{MAJ}$ to Node B only if potential $V_{MAJ}$ (supplied to the drain of transistor P2) is above P2's gate potential by more than the threshold voltage of transistor P2. Since the gate of transistor P2 is held at C2− (which is zero volts above ground in the described circumstances), transistor P2 will be on only when $V_{MAJ}$ is above the threshold voltage of P2. Since in typical implementations of the FIG. 4 circuit, there will be no significant loss of charge from capacitor C when node B is above ground potential by more than the threshold voltage of transistor P2, the described switching-off of transistor N3 (to prevent passing of undesirably low values of $V_{MAJ}$, e.g., undesirably large negative transient values of $V_{MAJ}$) is adequate to prevent significant charge loss from capacitor C during operation of the FIG. 4 circuit.

In FIG. 4, transistor P2 preferably is half the size of each PMOS transistor used in the series combination minor switches of typical implementations of the S-C circuit in which the invention is embodied, and transistor N2 preferably has the same size as each NMOS transistor used in the series combination minor switches of typical implementations of the S-C circuit in which the invention is embodied. Although transistor N2 can be connected between Node B and transistor N3 (as shown in FIG. 4), it is preferable instead to reverse the positions of transistors N2 and N3 (as in the above-discussed FIG. 6 embodiment) so that transistor N3 is connected between Node B and transistor N2, for the same reason (explained above) that FIG. 6 embodiment is preferable to the FIG. 2 embodiment. Also preferably, capacitor $C_{PP}$ connected between ground, and the gate of N10 (as shown in FIG. 4) has 20fF capacitance (when the other components of FIG. 4 have the indicated characteristics).

A variation on the FIG. 4 embodiment will next be described with reference to FIG. 5. The FIG. 5 circuit includes an overdrive protection transistor in series with each of transistors P2 and N2, and trigger circuitry for controlling both overdrive protection transistors. Thus, the FIG. 5 circuit is useful to protect against overdrive over a wider range of input potential $V_{IN}$ (a wider range of the difference between $V_{IN}$ and $V_{MAJ}$) than is the FIG. 2 (or FIG. 4) embodiment. Like the FIG. 4 circuit, the FIG. 5 circuit receives input potential $V_{IN}$ and reference potential $V_{MAJ}$, and normally asserts to Node B an output potential which is substantially equal to reference potential $V_{MAJ}$ when control bits C1−, C1+, C2−, and C2+ are respectively high (above the turn on potential of each NMOS transistor of FIG. 5 and the turn off potential of each PMOS transistor of FIG. 5), low (below the turn on potential of each NMOS transistor and the turn off potential of each PMOS transistor), low, and high. The FIG. 5 circuit has the same structure and function as the FIG. 4 circuit, except as explained below.

Figure 5:
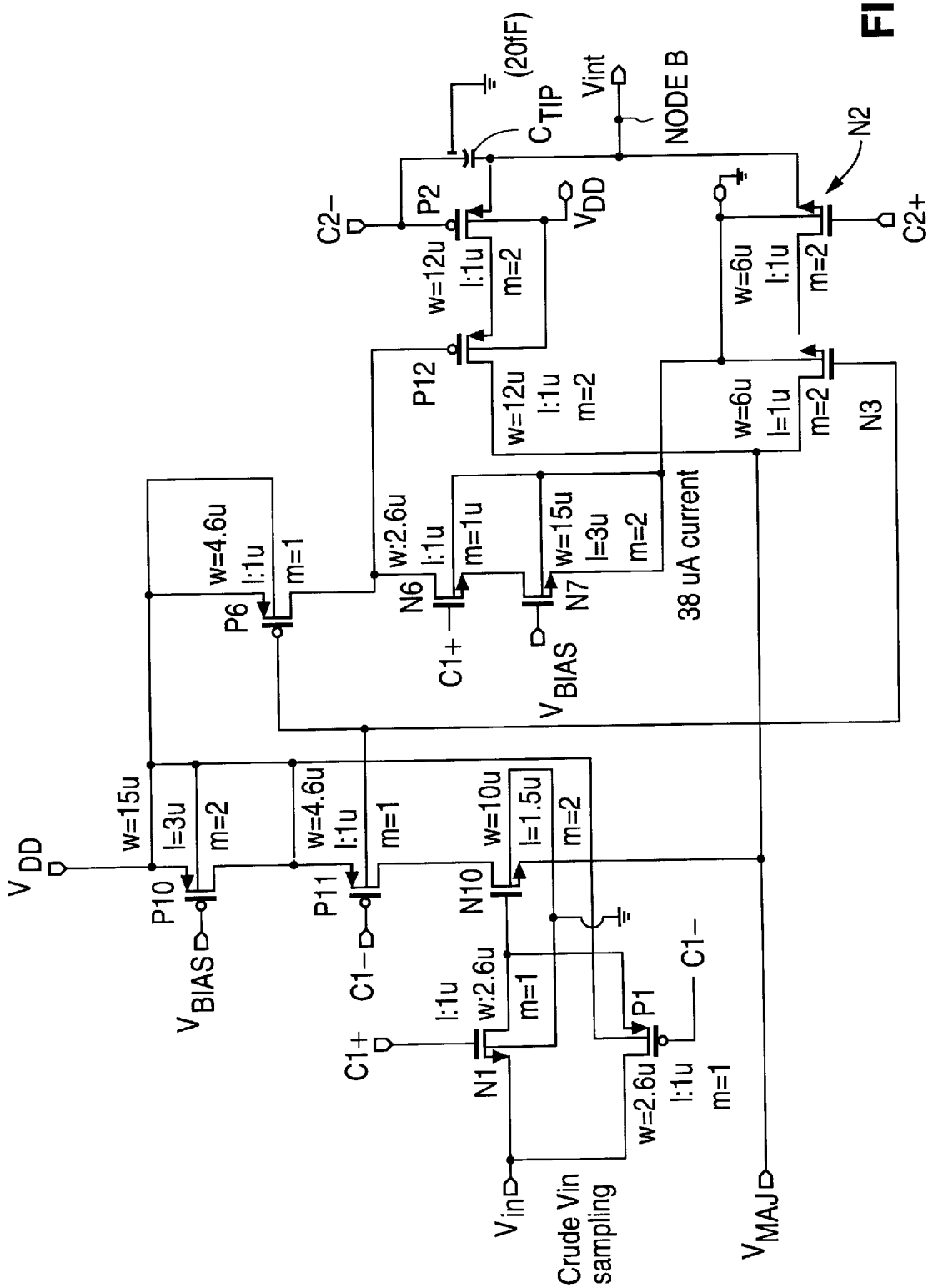
FIG. 5 is a schematic diagram of another embodiment of the inventive switch, which can replace the FIG. 2 circuit to implement switch S1B or S1C of FIG. 1.

As shown in FIG. 5, the channels of PMOS transistor P2 and NMOS transistor N2 are connected in parallel between the input node at potential $V_{MAJ}$ and output Node B. NMOS transistor N3 is connected (with its channel in series with that of transistor N2) between this input node and the drain of transistor N2, and PMOS transistor P12 is connected (with its channel in series with that of transistor P2) between this input node and the drain of transistor P2. The gates of P2 and N2 are coupled to receive control bit signals C2− and C2+, respectively.

Transistors N1, P1, N10, P6, N6, and N7 (connected as shown) comprise a trigger circuit for controlling the gate potential of transistor P12. Transistors N1, P1, N10, P10, and P11 (connected as shown) comprise another trigger circuit for controlling the gate potential of transistor N3. The channels of NMOS transistor N1 and PMOS transistor P1 are connected in parallel between the input node held at input potential $V_{IN}$ and the gate of NMOS transistor N10. The source of transistor N10 is coupled to receive $V_{MAJ}$ and to the common drains of transistors N3 and P12. NMOS transistors N6 and N7 are connected with their channels in series between the bottom rail and the drain of transistor P6. PMOS transistors P10 and P11 are connected with their channels in series between the top rail and the drain of transistor N10 (and the gate of transistor N3). The source of P6 is connected to the top rail, and the gate of P6 is connected to the drain of N10 (and to the gate of N3). The gates of transistors P1 and P11 are coupled to receive control bit signal C1−, the gates of N1 and N6 are coupled to receive control bit signal C1+, the gate of P10 is biased by a bias potential $V_{bias}$, and the gate of N7 is biased by another bias potential $V_{biasn}$.

Still with reference to FIG. 5, one plate of capacitor $C_{tip}'$ is connected to the gate of transistor P2, and the other plate is connected to Node B and thus to the common sources of transistors P2 and N2. Capacitor $C_{tip}'$ of FIG. 5 has the same function as does above-described capacitor $C_{tip}$ of FIG. 2. Capacitor $C_{tip}'$ has a capacitance of 20fF in the preferred implementation shown in FIG. 5.

In operation of the FIG. 5 circuit (when implemented as part of switch S1 of FIG. 1), control bits C1−, C1+, C2−, and C2+ are asserted to the FIG. 5 circuit with the following sequence of values:

first, C1− and C2+ are low and C1+ and C2− are high (during sampling, and assertion to Node B, of input potential $V_{IN}$ while switch S2 of FIG. 1 is closed to hold Node A at virtual ground potential Vb);

then, C1− and C2+ are high and C1+ and C2− are low (during assertion of reference potential $V_{MAJ}$ to Node B while switch S2 of FIG. 1 is open).

We first consider the manner in which the FIG. 5 circuit operates in the case that C1− and C2+ are low and C1+ and C2− are high. In this case, transistors N2 and P2 are off, and transistors N1, P1, P10, N6, N7, and P11 are on. Thus, input potential $V_{IN}$ is sampled (through the channel of transistor N1 and/or transistor P1) onto the gate of NMOS transistor N10. If the sampled input potential $V_{IN}$ is sufficiently high for transistor N10 to be on, a small DC current (e.g., 30 microAmps, with components having the characteristics indicated in FIG. 5) is drawn from the power supply through the channels of P10, P11, and N10. If the sampled input potential $V_{IN}$ is such that transistor P6 is on, a small DC current (e.g., 38 microAmps, with components having the characteristics indicated in FIG. 5) is drawn from the power supply through the channels of P6, N6, and N7. While control bits C1−, C2+, C1+, and C2− have the indicated values, a sample of input potential $V_{IN}$ can be passed through to one plate of the S-C circuit's capacitor C (by switch S1A of FIG. 1). While Node B moves to the sampled input potential $V_{IN}$, switch S2 of the S-C circuit (shown in FIG. 1) is in a closed configuration so that the other plate of capacitor C is at virtual ground. Switch S1A causes Node B to move rapidly to the sampled input potential $V_{IN}$.

After Node B is at the sampled input potential $V_{IN}$ and switch S2 has opened, each of control bits C1− and C2+ undergoes a transition to its high level and each of C1+ and C2− undergoes a transition to its low level. In response to the new control bits, transistors P2 and N2 turn on and transistors N1, P1, N6, and P11 turn off. The gate of NMOS transistor N10 is still at the sampled value of input potential $V_{IN}$, and since the source of transistor N10 is at $V_{MAJ}$ (which has a static value), if the sampled value of input potential $V_{IN}$ is sufficiently above $V_{MAJ}$ (i.e., more than an NMOS threshold voltage above $V_{MAJ}$), transistor N10 is on and transistor N10 pulls the gate of transistor N3 rapidly down to the potential $V_{MAJ}$. Thus, transistor N3 is off since its source and gate are at substantially the same potential. Also, since the gate of P6 is at $V_{MAJ}$, transistor P6 is on (assuming $V_{MAJ}$ is lower than supply potential $V_{DD}$, and the difference between and $V_{DD}$ and $V_{MAJ}$ is more than a threshold voltage of P6). If P6 is on, it pulls the gate of P12 to $V_{DD}$, and transistor P12 accordingly switches off (assuming that $V_{MAJ}$ is lower than supply potential $V_{DD}$, and the difference between and $V_{DD}$ and $V_{MAJ}$ is more than a threshold voltage of P12). Since transistors N3 and P12 are off, Node B is isolated from the input node at which $V_{MAJ}$ is received.

If the sampled value of input potential $V_{IN}$ is not more than an NMOS threshold voltage above $V_{MAJ}$ (when control bits C1− and C2+ undergo the transition to their high level and C1+ and C2− undergo the transition to their low level), transistor N10 does not switch on (in response to such transitions). In this case, one or both of transistor pair N3, N2 and transistor pair P12, P2 will remain on to pass through the reference potential $V_{MAJ}$ to Node B. Under the noted constraints on potentials $V_{IN}$ and $V_{MAJ}$ (and assuming that $V_{DD}$ is greater than the sampled value of $V_{IN}$, and that the sampled value of $V_{IN}$ is greater than $V_{MAJ}$), there will be no significant loss of charge from capacitor C even though potential $V_{MAJ}$ is passed through to Node B. Thus, the described switching-off of transistors N3 and P12 (to prevent passing of undesirably low values of $V_{MAJ}$, e.g., undesirably large negative transient values of $V_{MAJ}$) is adequate to prevent significant charge loss from capacitor C during operation of the FIG. 5 circuit.

Although transistor N2 can be connected between Node B and transistor N3, and transistor P2 can be connected between Node B and transistor P12 (as shown in FIG. 5), it is preferable to connect transistor N3 between Node B and transistor N2 (as shown in FIG. 6) rather than to connect transistor N2 between Node B and transistor N3 and to connect transistor P12 between Node B and transistor P2 rather than to connect transistor P2 between Node B and transistor P12. Thus, it is preferable to implement a variation on the FIG. 5 embodiment in which transistor N3 is connected between Node B and transistor N2 (as in above-described FIG. 6) and in which transistor P12 is connected between Node B and transistor P2, for the same reason (explained above) that FIG. 6 embodiment is preferable to the FIG. 2 embodiment (namely, so that transistors P12 and N3, when off, can prevent passing of parasitic charge to Node B).

Although only certain embodiments have been described in detail, those having ordinary skill in the art will certainly understand that many modifications are possible without departing from the teachings thereof. All such modifications are intended to be encompassed within the following claims.

What is claimed is:

1. An input switch for use in a switch-capacitor circuit, the switch-capacitor circuit including an amplifier having an input, a capacitor having a first plate coupled to the input and a second plate, and at least one NMOS transistor coupled to the input, wherein the input switch comprises:

an input node coupled to receive a reference potential;

an output node for coupling to the second plate of the capacitor;

a transmission gate including at least a first MOS transistor having a channel;

second MOS transistor having a channel and a gate, the channels of the first MOS transistor and the second MOS transistor connected in series between the input node and the output node; and trigger circuitry having an input coupled to receive an input potential, a node coupled to receive the reference potential, and an output coupled to the gate of the second MOS transistor, and operable in a sampling mode followed by an operating mode, said trigger circuitry being configured to sample the input potential in the sampling mode and to assert a control potential to the output in the operating mode, wherein the control potential prevents the transmission gate from passing the reference potential to the capacitor in the operating mode when the reference potential has such a level that a difference between the sampled input potential and the reference potential is below an overdrive-causing level.

2. The input switch of claim 1, wherein the trigger circuitry is configured to turn off the second MOS transistor during the sampling mode when the reference potential has such a level that the difference between the sampled input potential and the reference potential is below the overdrive-causing level.

3. The input switch of claim 2, wherein the first MOS transistor is an NMOS transistor, the second MOS transistor is a second NMOS transistor, and the trigger circuitry is configured to turn off the second MOS transistor during the sampling mode when the reference potential has a level that is sufficiently low to cause the difference between the sampled input potential and the reference potential to be below the overdrive-causing level.

4. The input switch of claim 3, wherein said input switch is coupled to receive a set of control bits and configured to operate in response to the control bits, and wherein the trigger circuitry includes:

a third NMOS transistor, having a source connected to the input node, a drain connected to a second node, and a gate;

a second transmission gate coupled and configured to selectively pass the input potential to the gate of the third NMOS transistor in response to a first subset of the set of control bits;

switching circuitry coupled to the second node and coupled to receive a second subset of the set of control bits, the switching circuitry being configured to selectively connect the second node to the gate of the second NMOS transistor.

5. The input switch of claim 3, wherein said input switch is coupled to receive a set of control bits and configured to operate in response to the control bits, and wherein the trigger circuitry includes:

a third NMOS transistor, having a source connected to the input node, a drain connected to the gate of the second NMOS transistor, and a gate; and switching circuitry coupled and configured to selectively pass the input potential to the gate of the third NMOS transistor in response to a first subset of the set of control bits.

6. The input switch of claim 3, wherein said input switch is coupled to receive a set of control bits and configured to operate in response to the control bits, and wherein the trigger circuitry includes:

a third NMOS transistor, having a source connected to the input node, a drain connected to a second node, and a gate;

a fourth NMOS transistor, having a source connected to the second node, a drain connected to the gate of the second NMOS transistor, and a gate; and switching circuitry coupled and configured to selectively pass the input potential to the gate of the third NMOS transistor in response to a first subset of the set of control bits.

7. The input switch of claim 3, wherein the trigger circuitry is configured to turn off the second NMOS transistor during the sampling mode when the reference potential is lower than the sampled input potential by an amount equal to at least an NMOS transistor threshold voltage.

8. The input switch of claim 3, wherein the trigger circuitry is configured to turn off the second NMOS transistor during the sampling mode when the reference potential is lower than the sampled input potential by an amount equal to at least twice an NMOS transistor threshold voltage.

9. The circuit of claim 3, wherein the first MOS transistor is connected between the output node and the second MOS transistor.

10. The input switch of claim 2, wherein the first MOS transistor is a PMOS transistor, the second MOS transistor is a second PMOS transistor, and the trigger circuitry is configured to turn off the second MOS transistor during the sampling mode when the reference potential has a level that is sufficiently high to cause the difference between the sampled input potential and the reference potential to be below the overdrive-causing level.

11. The input switch of claim 10, wherein the trigger circuitry is configured to turn off the second NMOS transistor during the sampling mode when the reference potential is lower than a top rail supply potential by an amount equal to not more than an NMOS transistor threshold voltage.

12. The input switch of claim 1, wherein the first MOS transistor is a first NMOS transistor, the transmission gate also includes a first PMOS transistor having a channel, the second MOS transistor is second NMOS transistor, and wherein the input switch also includes:

a second PMOS transistor having a channel and a gate, the channels of the first PMOS transistor and the second PMOS transistor connected in series between the input node and the output node, wherein the trigger circuitry is configured to turn off the second NMOS transistor during the sampling mode when the reference potential has a level that is sufficiently low to cause the difference between the sampled input potential and the reference potential to be below the overdrive-causing level, and to turn off the second PMOS transistor during the sampling mode when the reference potential has a level that is sufficiently high to cause the difference between the sampled input potential and the reference potential to be below the overdrive-causing level.

13. The input switch of claim 12, wherein said input switch is coupled to receive a set of control bits and configured to operate in response to the control bits, and wherein the trigger circuitry includes;

a third NMOS transistor, having a source connected to the input node, a drain connected to a second node, and a gate;

a fourth NMOS transistor, having a source connected to the second node, a drain connected to the gate of the second NMOS transistor, and a gate; and a second transmission gate coupled and configured to selectively pass the input potential to the gate of the third NMOS transistor in response to a first subset of the set of control bits;

switching circuitry coupled to the drain of the fourth NMOS transistor and the gate of the fourth NMOS transistor and coupled to receive a second subset of the set of control bits, the switching circuitry being configured to selectively connect the second node to the gate of the second NMOS transistor.

14. The input switch of claim 1, wherein assertion of the reference potential to the output node upon entry of the input switch into the operating mode decreases the potential of said output node, and wherein the input switch also includes:

a tipping capacitor having a plate connected to the output node and another plate coupled to receive a control potential, said control potential having a first value in the sampling mode and a second value in the operating mode, whereby the tipping capacitor pulls the output node to a decreased potential upon entry of the input switch into the operating mode even when the transmission gate is prevented from passing the reference potential to said output node.

15. The input switch of claim 2, wherein the second MOS transistor is connected between the output node and the first MOS transistor.

16. A switch-capacitor circuit, including:

an amplifier having an input;

a capacitor having a first plate coupled to the input and a second plate;

at least one NMOS transistor coupled to the input; and an input switch, wherein the input switch comprises:

an input node coupled to receive a reference potential;

an output node for coupling to the second plate of the capacitor;

a transmission gate including at least a first MOS transistor having a channel;

a second MOS transistor having a channel and a gate, the channels of the first MOS transistor and the second MOS transistor connected in series between the input node and the output node; and trigger circuitry having an input coupled to receive an input potential, a node coupled to receive the reference potential, and an output coupled to the gate of the second MOS transistor, and operable in a sampling mode followed by an operating mode, said trigger circuitry being configured to sample the input potential in the sampling mode and to assert a control potential to the output in the operating mode, wherein the control potential prevents the transmission gate from passing the reference potential to the capacitor in the operating mode when the reference potential has such a level that a difference between the sampled input potential and the reference potential is below an overdrive-causing level.

17. The switch-capacitor circuit of claim 16, wherein the trigger circuitry is configured to turn off the second MOS transistor during the sampling mode when the reference potential has such a level that the difference between the sampled input potential and the reference potential is below the overdrive-causing level.

18. The switch-capacitor circuit of claim 17, wherein the first MOS transistor is an NMOS transistor, the second MOS transistor is a second NMOS transistor, and the trigger circuitry is configured to turn off the second MOS transistor during the sampling mode when the reference potential has a level that is sufficiently low to cause the difference between the sampled input potential and the reference potential to be below the overdrive-causing level.

19. The switch-capacitor circuit of claim 18, wherein said input switch is coupled to receive a set of control bits and configured to operate in response to the control bits, and wherein the trigger circuitry includes:

a third NMOS transistor, having a source connected to the input node, a drain connected to a second node, and a gate;

a second transmission gate coupled and configured to selectively pass the input potential to the gate of the third NMOS transistor in response to a first subset of the set of control bits;

switching circuitry coupled to the second node and coupled to receive a second subset of the set of control bits, the switching circuitry being configured to selectively connect the second node to the gate of the second NMOS transistor.

20. The switch-capacitor circuit of claim 18, wherein said input switch is coupled to receive a set of control bits and configured to operate in response to the control bits, and wherein the trigger circuitry includes:

a third NMOS transistor, having a source connected to the input node, a drain connected to the gate of the second NMOS transistor, and a gate; and switching circuitry coupled and configured to selectively pass the input potential to the gate of the third NMOS transistor in response to a first subset of the set of control bits.

21. The switch-capacitor circuit of claim 18, wherein said input switch is coupled to receive a set of control bits and configured to operate in response to the control bits, and wherein the trigger circuitry includes:

a third NMOS transistor, having a source connected to the input node, a drain connected to a second node, and a gate;

a fourth NMOS transistor, having a source connected to the second node, a drain connected to the gate of the second NMOS transistor, and a gate; and switching circuitry coupled and configured to selectively pass the input potential to the gate of the third NMOS transistor in response to a first subset of the set of control bits.

22. The switch-capacitor circuit of claim 18, wherein the trigger circuitry is configured to turn off the second NMOS transistor during the sampling mode when the reference potential is lower than the sampled input potential by an amount equal to at least an NMOS transistor threshold voltage.

23. The switch-capacitor circuit of claim 18, wherein the trigger circuitry is configured to turn off the second NMOS transistor during the sampling mode when the reference potential is lower than the sampled input potential by an amount equal to at least twice an NMOS transistor threshold voltage.

24. The circuit of claim 18, wherein the second MOS transistor is connected between the output node and the first MOS transistor.

25. The switch-capacitor circuit of claim 16, wherein the first MOS transistor is a PMOS transistor, the second MOS transistor is a second PMOS transistor, and the trigger circuitry is configured to turn off the second MOS transistor during the sampling mode when the reference potential has a level that is sufficiently high to cause the difference between the sampled input potential and the reference potential to be below the overdrive-causing level.

26. The switch-capacitor circuit of claim 25, wherein the trigger circuitry is configured to turn off the second NMOS transistor during the sampling mode when the reference potential is lower than a top rail supply potential by an amount equal to not more than an NMOS transistor threshold voltage.

27. The switch-capacitor circuit of claim 16, wherein the first MOS transistor is a first NMOS transistor, the transmission gate also includes a first PMOS transistor having a channel, the second MOS transistor is second NMOS transistor, and wherein the input switch also includes:

a second PMOS transistor having a channel and a gate, the channels of the first PMOS transistor and the second PMOS transistor connected in series between the input node and the output node, wherein the trigger circuitry is configured to turn off the second NMOS transistor during the sampling mode when the reference potential has a level that is sufficiently low to cause the difference between the sampled input potential and the reference potential to be below the overdrive-causing level, and to turn off the second PMOS transistor during the sampling mode when the reference potential has a level that is sufficiently high to cause the difference between the sampled input potential and the reference potential to be below the overdrive-causing level.

28. The switch-capacitor circuit of claim 27, wherein said input switch is coupled to receive a set of control bits and configured to operate in response to the control bits, and wherein the trigger circuitry includes:

a third NMOS transistor, having a source connected to the input node, a drain connected to a second node, and a gate;

a fourth NMOS transistor, having a source connected to the third node, a drain connected to the gate of the second NMOS transistor, and a gate;

a second transmission gate coupled and configured to selectively pass the input potential to the gate of the third NMOS transistor in response to a first subset of the set of control bits; and switching circuitry coupled to the second node and coupled to receive a second subset of the set of control bits, the switching circuitry being configured to selectively connect the second node to the gate of the second NMOS transistor.

29. The switch-capacitor circuit of claim 16, wherein assertion of the reference potential to the output node upon entry of the input switch into the operating mode decreases the potential of said output node, and wherein the input switch also includes:

a tipping capacitor having a plate connected to the output node and another plate coupled to receive a control potential, said control potential having a first value in the sampling mode and a second value in the operating mode, whereby the tipping capacitor pulls the output node to a decreased potential upon entry of the input switch into the operating mode even when the transmission gate is prevented from passing the reference potential to said output node.

30. The switch-capacitor circuit of claim 17, wherein the second MOS transistor is connected between the output node and the first MOS transistor.

31. The switch-capacitor circuit of claim 16, wherein the at least one NMOS transistor is an NMOS transistor having a channel connected between the input of the amplifier and an output of the amplifier, and a gate coupled to receive a switch control signal so that said NMOS transistor is controllable in response to the switch control signal to be in a closed state in the sampling mode and in an open state in the operating mode.

32. The switch-capacitor circuit of claim 16, wherein said switch-capacitor circuit has unified architecture, and the at least one NMOS transistor is an NMOS transistor having a channel connected between the input of the amplifier and an output of the amplifier, and having a gate coupled to receive a switch control signal so that said NMOS transistor is controllable in response to the switch control signal to be in a closed state in the sampling mode and in an open state in the operating mode.

* * * * *